United States Patent
Bauer et al.

(10) Patent No.: US 7,071,711 B2
(45) Date of Patent: Jul. 4, 2006

(54) METHOD AND DEVICE FOR DETERMINING THE RATIO BETWEEN AN RC TIME CONSTANT IN AN INTEGRATED CIRCUIT AND A SET VALUE

(75) Inventors: Achim Bauer, Villach (AT); Martin Trojer, Klagenfurt (AT); Ulrich Gaier, Velden (AT)

(73) Assignee: Micronas GmbH, Freiburg (DE)

( * ) Notice: Subject to any disclaimer, the term of this patent is extended or adjusted under 35 U.S.C. 154(b) by 0 days.

(21) Appl. No.: 10/884,018

(22) Filed: Jul. 2, 2004

(65) Prior Publication Data

US 2005/0035772 A1    Feb. 17, 2005

(30) Foreign Application Priority Data

Jul. 2, 2003    (DE) ................................ 103 29 856

(51) Int. Cl.
*G01R 27/26* (2006.01)
(52) U.S. Cl. ...................... 324/678; 324/711; 324/677; 324/679

(58) Field of Classification Search ........ 324/677–679, 324/711
See application file for complete search history.

(56) References Cited

U.S. PATENT DOCUMENTS

| 5,274,334 | A | * | 12/1993 | Mills | ............................ 324/678 |
| 6,262,603 | B1 | * | 7/2001 | Mohan et al. | ................. 327/77 |
| 6,628,163 | B1 | | 9/2003 | Dathe et al. | ................. 327/553 |
| 6,640,628 | B1 | * | 11/2003 | Lutke et al. | .............. 73/290 V |
| 6,753,695 | B1 | * | 6/2004 | Toda et al. | ................... 326/29 |

FOREIGN PATENT DOCUMENTS

| JP | 05209929 | 1/1992 | .................... 31/26 |
| JP | 10206489 | 1/1997 | .................... 31/26 |

* cited by examiner

*Primary Examiner*—Diane Lee
*Assistant Examiner*—Marina Kramskaya
(74) *Attorney, Agent, or Firm*—O'Shea, Getz & Kosakowski, P.C.

(57) ABSTRACT

A method and device for determining the ratio between the actual value of an RC time constant of an RC network embodied in an integrated circuit and a set value of the RC time constant includes first and second reference RC networks each having a resistor and a capacitor. The two RC networks may be oppositely connected in a circuit arrangement between first and second supply potentials, where the product of the resistance and capacitance values of the two RC networks may be equal. A normalized RC time constant may be defined for the two reference RC networks. Successive charge and discharge cycles are implemented during a predetermined evaluation period, the two capacitors being charged in a cycle during a charge time until the potential at a first node of the first reference RC network approximately corresponds to the potential at a second node of the second reference RC network. The two capacitors may be subsequently discharged for a discharge time. The evaluation period may be matched to the normalized RC time constant such that, assuming the RC time constant of the two reference RC networks corresponds to the normalized RC time constant, a predetermined number of charge and discharge cycles can be implemented during the evaluation period. The number of charge and discharge cycles actually implemented may be determined, and the quotient of the predetermined number and the determined number may be generated to provide the ratio between the measured RC time constant and the normalized RC time constant.

19 Claims, 3 Drawing Sheets

METHOD AND DEVICE FOR DETERMINING THE RATIO BETWEEN AN RC TIME CONSTANT IN AN INTEGRATED CIRCUIT AND A SET VALUE

PRIORITY INFORMATION

This application claims priority from German application 103 29 856.8-35, filed Jul. 2, 2003.

BACKGROUND OF THE INVENTION

The present invention relates in general to integrated circuits and in particular to a method and a device for determining the ratio between an actual value of an RC time constant in an integrated circuit or chip and a set or desired value of the RC time constant.

Resistor-capacitor ("RC") circuit networks or elements (hereinafter "RC network") that have at least one ohmic resistor and at least one capacitor connected together may be used in many applications. Examples include timing elements or filters. One parameter describing the response of such an RC network is its time constant which may be derived from the product of the capacitance value of the one or more capacitive components and the resistance value of the one or more ohmic components. Depending on fabrication-related fluctuations and/or the operating conditions associated with a circuit that includes an RC network, the actual or measured value of the time constant can fluctuate significantly relative to an expected or desired fabrication-specific set value of the time constant. For example, variances (sigma values) of approximately 6% of the actual value from the set value may commonly occur.

As a result of these fluctuations, it may be desirable to determine the value of the RC time constant before using a circuit that includes such an RC network to be able to calibrate the circuit. Depending on the intended application, the calibration may be performed on a one-time basis after fabrication of the circuit that includes the RC network, or may be performed during circuit operation in conjunction with changing conditions of use.

FIG. 1 is a schematic diagram of a prior art low-pass filter that comprises an RC network 10. The network 10 may comprise, for example, two resistors 12, 14 connected in series with a parallel connection of a plurality of capacitors 16–22. Two of the capacitors 20, 22 can each be selectively connected or disconnected into or out of the network 10 by corresponding switches 24, 26, to thereby calibrate the RC network 10.

In known methods for determining an RC time constant, charging and discharging processes of the capacitor(s) of an RC network may be implemented, where the assumption may be made that the RC time constant of any additional RC networks in a circuit may respond in terms of a set value in a manner analogous to that of the measured RC network. The actual value of the time constant can be determined based on the time required to charge the capacitor of the reference RC network from a lower reference voltage value up to an upper reference voltage value, or to discharge the capacitor from an upper reference voltage value to a lower reference voltage value, together with the knowledge of the upper and lower reference voltage values. The accuracy with which the time constant can be determined by such a method may be a function of the accuracy with which the required time references and reference voltages are provided or determined. The charge or discharge times determined may be quantified by the multiple of clock pulse periods of a clock signal serving as the time reference. The accuracy in determining the time constant may increase with the clock rate of the clock signal and with an increasing duration of the charging and discharging processes. Extending the charge and discharge times can be achieved by increasing the time constant of the reference RC network, which may undesirably require a physically larger resistor and/or a larger capacitor, and thus a larger surface area on the chip or integrated circuit.

What is needed is a method and device for determining the ratio between the actual value of the RC time constant of at least one RC network in an integrated circuit and a set value of the RC time constant, where a relatively accurate determination of this ratio may be provided with a small surface area requirement on the integrated circuit and with low circuit complexity.

SUMMARY OF THE INVENTION

A method for determining the ratio between the actual value of an RC time constant of an RC network embodied in an integrated circuit and a set value of the RC time constant may include the steps of providing a first reference RC network having a resistor and a capacitor, and a second RC network having a resistor and a capacitor. The two RC networks may be oppositely connected in a circuit arrangement between first and second supply potentials, where the product of the resistance and capacitance values of the two RC networks may be equal. A step may be performed that defines a normalized RC time constant for the two reference RC networks, followed by a step of implementing successive charge and discharge cycles during a predetermined evaluation period, where the two capacitors may be charged in a cycle during a charge time until the potential at a first node common to the resistor and capacitor of the first reference RC network approximately corresponds to the potential at a second node common to the resistor and capacitor of the second reference RC network, and where the two capacitors may be subsequently discharged for a discharge time. The evaluation period may be matched to the normalized RC time constant such that, assuming the RC time constant of the two reference RC networks corresponds to the normalized RC time constant, a predetermined number of charge and discharge cycles can be implemented during this evaluation period. A step may then be performed that determines the number of charge and discharge cycles actually implemented, and the quotient of the predetermined number and the determined number may be generated to provide a measure of the ratio between the measured RC time constant and the normalized RC time constant.

The resistors of the two reference RC networks may each have the same resistance value, while the capacitors of the two reference RC networks may each have the same capacitance value. Thus, the product of the resistance value and capacitance value of each of the two reference elements may be equal.

In the method in which two reference RC networks may be provided in an integrated circuit, and in which a measure of the ratio of the RC time constants of the RC networks to a normalized RC time constant may be determined, the RC time constants of all of the RC networks may deviate in the same degree relative to their set value as does the actual RC time constant of the two measured reference networks from the normalized RC time constant of these networks.

The discharge time of the capacitors of the reference RC networks after a charging process may be fixed and, as a result, the time period of a cycle comprising one charging process and one discharging process for one reference network may comprise a charge time dependent on the RC time constant and a fixed discharge time. If the evaluation period is selected such that during this evaluation period a number N of charge and discharge processes can occur whenever the time constant of the reference networks corresponds to the normalized time constant, then the ratio of this predetermined number N and a number P of the actually occurring charge and discharge processes produces the ratio between the actual time constant and the normalized time constant. If the actual time constant is greater than the normalized time constant, then there are fewer charge and discharge processes, and the ratio between the predetermined number N and the actual number P may be greater than one. If the time constant is smaller than the normalized time constant, then more charge and discharge processes may occur during the evaluation period, with the result that the ratio of the predetermined number and actual number may be less than one.

A counter may be provided to determine the evaluation period, where the counter may be controlled by a clock signal. At the beginning of the evaluation period, the counter may begin to count in time a clock cycle, the evaluation period ending when the counter has increased or decreased its count by one value that corresponds to the quotient of the desired evaluation period and the clock period of the clock signal.

A comparator may be provided to evaluate the potentials at the first and second nodes of the reference RC networks, where output signals from the comparator may control a counter which may be reset at the beginning of the evaluation period and which, at the end of the evaluation period, may provide a value corresponding to the number of charge and discharge cycles that have occurred.

One switch each may be connected in parallel to the first and second capacitors to discharge the capacitors of the reference RC networks, where the capacitors may be discharged for a predetermined discharge time by these switches depending on the output signal of the comparator.

A corresponding device for determining the ratio between an actual value of an RC time constant of an RC network embodied in an integrated circuit and a predetermined or set value of the RC constant may include a first reference RC network having a resistor and a capacitor, and a second reference RC network having a resistor and a capacitor. The two RC networks may be oppositely connected between first and second supply potentials, where the product of the resistance and capacitance values of the resistors and capacitors for the two RC networks may be equal. The device may also include a comparator with a first input connected to a first node common to the resistor and capacitor of the first RC network, and with a second input connected to a second node common to the resistor and capacitor of the second RC network. A counter may be included, the count of which may be increased or decreased by an output signal from the comparator as clocked within an evaluation period. First and second discharge circuits may be provided which may be connected to the two capacitors and may discharge the two capacitors depending on the output signal of the comparator. The device may also include a mechanism for the logical-circuit-based generation of a quotient from a set value that represents a measure for a normalized RC time constant of the reference RC networks and the actual value which is the actual RC time constant.

The discharge circuits may each comprise a switch connected in parallel to the two capacitors. The switches may be closed, depending on the output signal of the comparator, for a predetermined time period corresponding to the discharge time after at least an approximately identical potential has been detected at the first and second nodes.

The method and device provide a value that corresponds to the ratio between a normalized time constant and an actual RC time constant of the reference RC networks. This value can be utilized to calibrate the RC networks in an integrated circuit which may, for example, be components of filters. If the method determines, for example, that the actual RC time constant of the reference networks deviates percentage-wise by a certain amount from a set value, then it can be assumed that the RC time constants of the remaining RC networks in the integrated circuit may also deviate by the same amount from their set values. These uniform deviations for all RC networks of an integrated circuit may be caused by a common process which is subject to manufacturing tolerances, or to environmental conditions which all of the RC networks also experience in common. The information obtained from the ratio of the RC constants of the reference RC networks to a preset value can be employed to calibrate the other RC networks besides the reference RC networks, in the integrated circuit.

For example, RC networks in integrated low-pass filters may usually be designed such that the capacitor of the RC network may include a plurality of capacitors connected in parallel, each of which has the same capacitance value. By knowing the percentage deviation of the RC time constant of such an RC network from a preset value, it may be possible to disconnect or connect various one or more of the capacitors to compensate for fabrication-related or environmentally related fluctuations to set a predetermined value for the RC time constant which determines the corner frequency of a low-pass filter designed as an RC network.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
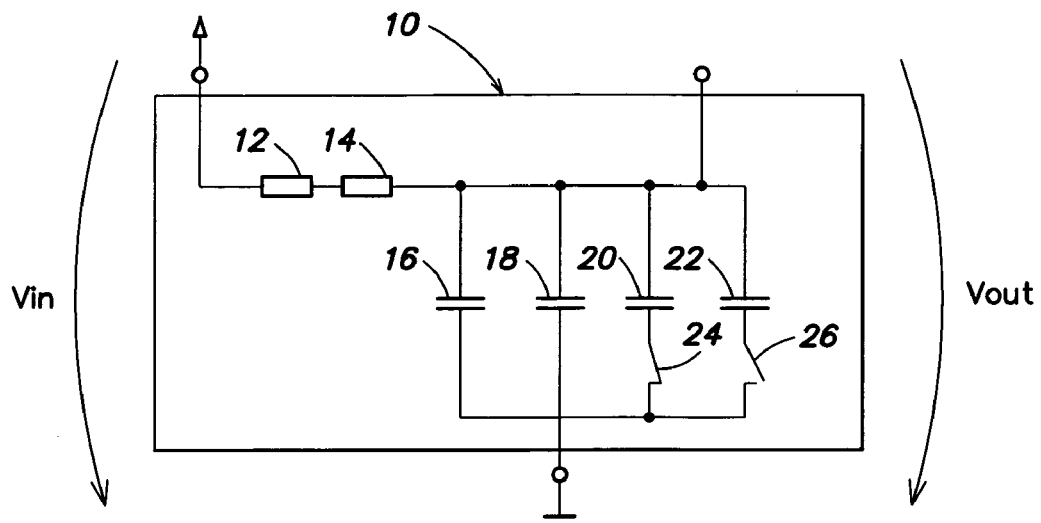
FIG. 1 is a schematic diagram of a prior art RC network.
Figure 2:
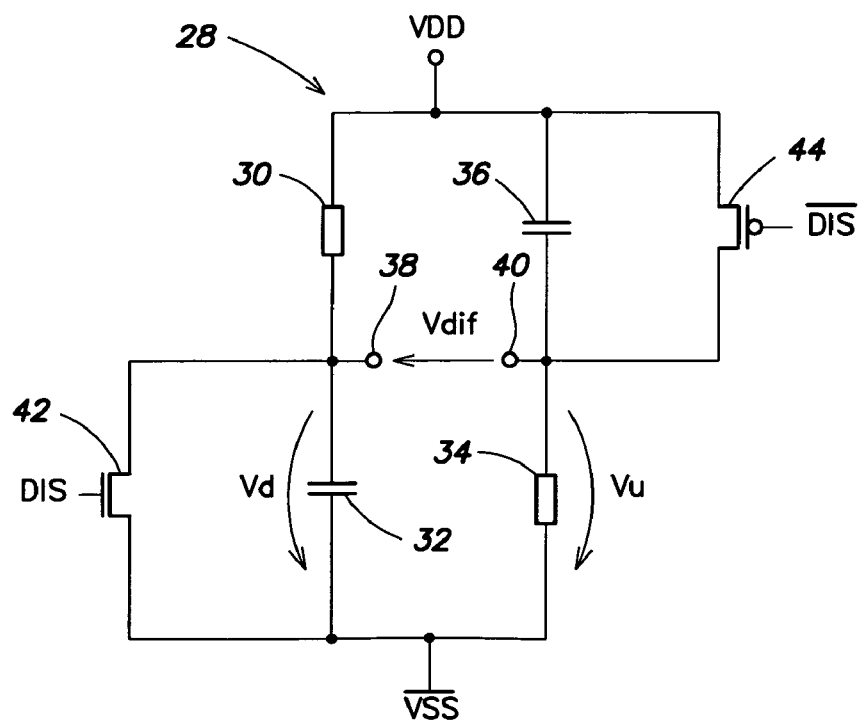
FIG. 2 is a schematic diagram of a circuit with two reference RC networks oppositely connected between first and second supply potentials.

Referring to FIG. 2, a circuit 28 may include a first reference RC network which may comprise a series circuit with a first resistor 30 and a first capacitor 32 connected between a first supply potential VDD and a second supply potential VSS, and with a second reference RC network which may comprise a second resistor 34 and a second capacitor 36 connected in series between the first and second supply potentials VDD, VSS. The two reference networks may be oppositely connected in the circuit 28 between the two supply potentials VDD, VSS, that is, the first resistor 30 and the second capacitor 36 may be connected in common to the first supply potential VDD, while the first capacitor 32 and the second resistor 34 may be connected in common to the second supply potential VSS.

A differential voltage Vdif can be measured between a first node 38 common to the first resistor 30 and the first capacitor 32 for the first reference RC network, and a second node 40 common to the second resistor 34 and the second capacitor 36 for the second reference RC network. This differential voltage may correspond to the difference of a voltage Vu across the second resistor 34 and a voltage Vd across the first capacitor 32.

Figure 3:
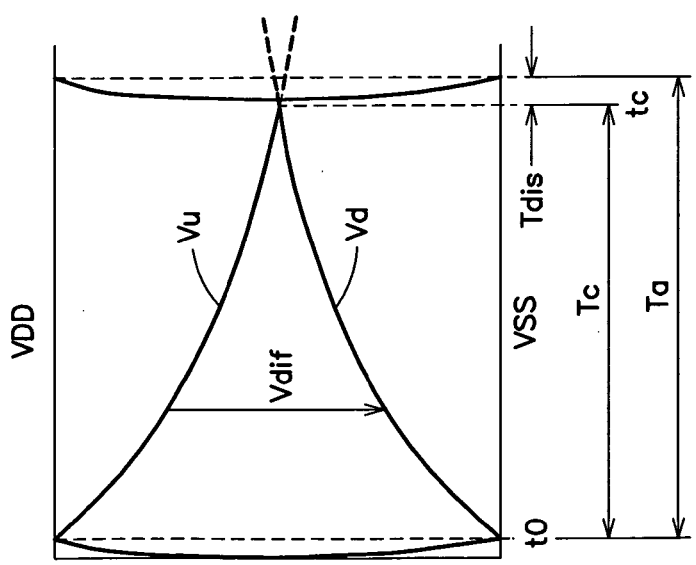
FIG. 3 illustrates voltages at first and second nodes of the circuit in FIG. 2 as a function of time.

FIG. 3 illustrates the characteristics as a function of time of the voltage Vu and the voltage Vd for a control period which begins at time t0 at which the first and second capacitors 32, 36 may be completely discharged. In the following discussion, it may be assumed that the resistances of switches 42 and 44 discussed hereinafter can be neglected, so that the potential at the second node 40 at time t0 may correspond to the first supply potential VDD, while the potential at the first node 38 may correspond to the second supply potential VSS.

The discharge of the first and second capacitors 32, 36 may be implemented in the embodiment by the switches 42, 44 in the form of transistors, the load paths of which may be connected in parallel across the capacitors 32, 36, respectively. These switches 42, 44 may be closed before time t0 to discharge the capacitors 32, 36. When the switches 42, 44 may be opened at time t0, the voltage Vu falls exponentially and voltage Vd rises exponentially. The curve of the voltage Vu and the curve of the voltage Vd may thus intersect at time tc at which the differential voltage Vdif is zero. At this time:

$$(VDD-VSS)\cdot e^{-(tc-t0)/\tau}+VSS=(VDD-VSS)\cdot(1-e^{-(tc-t0)/\tau})$$ Eq. (1)

Here, $\tau$ is the time constant for each of the two reference RC networks of FIG. 2, the time constant $\tau$ being defined by:

$$\tau=R\cdot C$$ Eq. (2)

where R is the resistance value of the first and second resistors 30, 34, and C is the capacitance value of the first and second capacitors 32, 36.

If Tc=tc−t0, then solving equation (1) for Tc yields:

$$Tc=\tau\cdot ln(1+(VDD-VSS)/(VDD-VSS))=\tau\cdot ln2$$ Eq. (3)

The charge time Tc starting from the discharged state for the first and second capacitors 32, 36 up to the parity of the voltages Vu and Vd may thus be proportional to the RC time constant of the two reference networks. Starting from time tc, at which the differential voltage Vdif is zero, the first and second capacitors 32, 36 may be discharged for a predetermined time period which is denoted as Tdis in FIG. 3. For the duration Ta of a control cycle, the applicable equation is:

$$Ta=Tc+Tdis$$ Eq. (4)

where Tc is a function of the RC time constant $\tau$.

In the method, successive charge and discharge cycles may be implemented as illustrated in FIG. 3 during an evaluation period T. The applicable equation for the evaluation period T is:

$$T=N\cdot(ln2\cdot\tau n+Tdis)$$ Eq. (5)

where the term $\tau n$ denotes a normalized RC time constant that represents a preset value for the time constant of the reference RC networks of FIG. 2. Evaluation period T may thus be selected so that N number of charge and discharge cycles can be implemented during the evaluation period whenever the time constant for the RC networks corresponds to the normalized time constant.

Assuming that the actual time constant for the RC reference networks deviates from the normalized time constant value, there may be P number of charge and discharge cycles within the evaluation period T, where:

$$P\cdot(ln2\cdot\tau+Tdis)=N\cdot(ln2\cdot\tau n+Tdis)$$ Eq. (6)

Given the assumption that time constants $\tau$ and $\tau n$ are significantly larger than discharge time Tdis, from Equation (6) it follows that:

$$V=P/N=\tau n/\tau$$ Eq. (7)

The ratio between the actual time constant $\tau$ and the normalized time constant $\tau n$ may correspond to the ratio of the predetermined number N and the number P of the charge and discharge cycles actually occurring during the evaluation period.

This ratio between the actual time constant and the normalized time constant of the reference networks may also apply for the time constants of all other RC networks of the integrated circuit, assuming that the resistors and capacitors used in the RC networks have been fabricated by the same processes and are thus subject to the same fabrication-related fluctuations as the resistors and capacitors of the reference networks.

Figure 4:
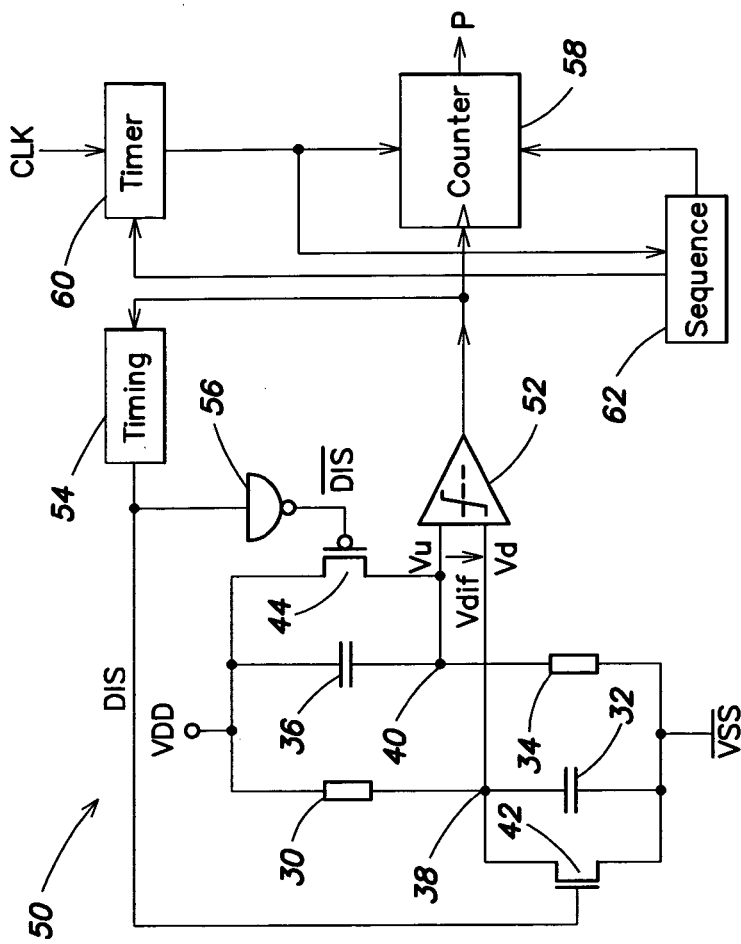
FIG. 4 is a schematic diagram of an evaluation circuit for determining a ratio of the time constants of the RC networks of FIG. 2 relative to a normalized time constant.

Referring to FIG. 4 the circuit 50 illustrated there includes the components of the circuit 28 of FIG. 2, including the two reference RC networks with the two resistors 30, 34 and the two capacitors 32, 36 oppositely connected between the first and second supply potentials VDD, VSS. The circuit 50 of FIG. 4 may also include a comparator 52, one input terminal of which may be connected to the first node 38 common to the first resistor 30 and the first capacitor 32, and the other input terminal of the comparator 52 may be connected to the second node 40 common to the second resistor 34 and the second capacitor 36. Assuming that the input of the comparator 52 connected to the second node 40 may be the non-inverting input and the input connected to first node 38 may be the inverting input of the comparator 52, the comparator 52 may supply an output signal which has a falling edge whenever the voltage Vu across the second resistor 34 falls below the voltage Vd across the first capacitor 32, that is, whenever the differential voltage Vdif is momentarily zero. A timing element 54 may be connected to the output of the comparator 52. The timing element 54 may provide an output signal DIS which, after each falling edge of the comparator output signal 52, has a high level for a time Tdis corresponding to the discharge time to close the first and second switches 42, 44 for the discharge time Tdis and to discharge the two capacitors 32, 36. The timing element 54 may have a high level after each rising edge of the comparator output signal for time Tdis.

The output signal DIS from the timing element 54 may be provided directly to the first switch 42, which may comprise an n-channel transistor. The second switch 44 may be a p-channel transistor, so that the output signal DIS from the timing element 54 may be inverted through an inverter 56 and provided as the inverse of the signal DIS to the switch 44 to turn on the transistor switch 44 during the discharge time Tdis.

The output signal from the comparator 52 may also be provided to a counter 58 which, in time with the comparator output signal, may be incremented during an evaluation period with every falling edge of the comparator output signal. The duration of the evaluation period may be specified by a timer signal which may be provided by a timer 60 and which, for example, has a low level as long as the counter 58 is incremented in time with the comparator output signal.

The timer 60 may, for example, be a digital counter that increases or decreases its count in time with a clock signal CLK provided to the timer 60. At the start of an evaluation period, the count may be set to zero and the counter 58 may be incremented with each clock pulse of the clock signal until a count determining the evaluation period has been reached. Alternatively, the count may be set at the start of the evaluation period to the value determining the evaluation period, and the count is decreased with each clock pulse of the signal until the count has reached zero. The count determining the evaluation period may be selected so that the quotient of the evaluation period and the clock period of the clock signal corresponds to the count up to which incrementing takes place, or down to which decrementing takes place.

The timer 60 may provide the timer signal to enable the counter 58 to be incremented depending on the comparator output signal. The timer signal may enable the counter 58 at the start of the counting operation, and may disable the counter 58 when the final count for the timer 60 has been reached.

The circuit 50 may also include a sequence control system 62 connected to the counter 58 and the timer 60, and which starts the evaluation process, for the purpose of which the timer 60 may be set to zero or to the predetermined count, and the counter 58 may be set to zero.

At the end of the evaluation period determined by the timer signal, the counter 58 may be disabled so as not to be further incremented, where the counter 58 may maintain its final count P up to the start of the next evaluation period determined by the sequence control system 62, and the counter 58 supplies this count P at its output.

The evaluation period during which the counter 58 may be incremented depending on the comparator output signal may be matched to the normalized RC time constant and the discharge time such that a predetermined number of charge and discharge cycles may be implemented whenever the RC time constant of the RC reference networks corresponds to the normalized RC time constant. If the time constant of the reference networks deviates from the normalized time constant, at the end of the evaluation period a count P may be set which deviates from the predetermined number N. The ratio of count P of the counter 58 at the end of the evaluation period and the predetermined number N may correspond to the ratio of the normalized RC time constant and the actual time constant of the reference RC networks.

This ratio of the count to the predetermined number may be determined if $N=2^n$ for the count and the counter 58 is a binary counter with a length of n bits. As such, the binary count may directly represent a measure of the desired ratio between the count of counter 58 and the predetermined number, which measure may correspond, as discussed hereinabove, to the ratio of the normalized time constant and the actual time constant. The ratio may be obtained by dividing the count P by the predetermined number N, where this may be obtained when $N=2^n$ by a relatively simple "point shift," that is, an interpretation of the bit for $2^n$ as $2^0$, of the bit for $2^{n-1}$ as $2^{-1}$, etc. The reciprocal value of this obtained value may then correspond to the ratio of the actual time constant to the normalized RC time constant.

To determine a deviation for the final count of the counter 58 from the predetermined value, it may be possible to delete the Most Significant Bit (MSB) when the MSB is one, and to delete the MSB and the two's complement of the remaining value when the MSB is zero.

This ratio may be utilized, for example, to calibrate the RC networks in the same integrated circuit as the reference RC networks, as described hereinbelow with reference to FIG. 5.

Figure 5:
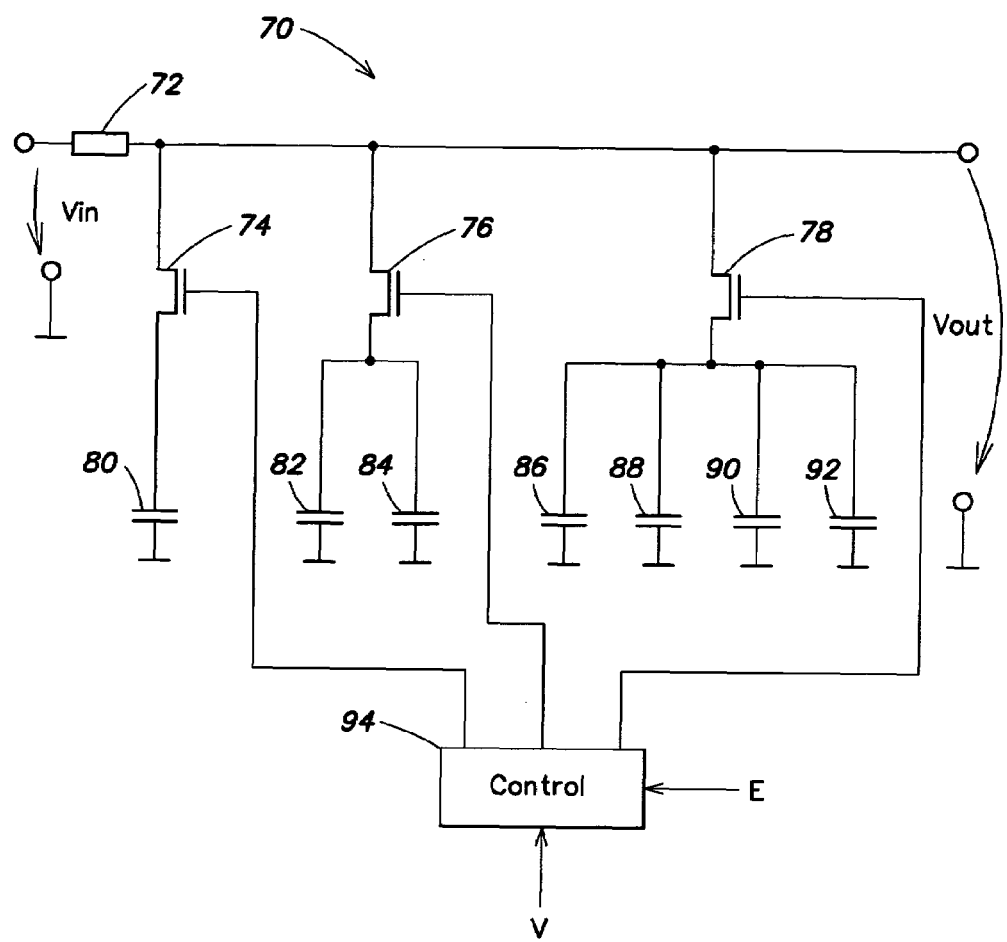
FIG. 5 is a schematic diagram of an embodiment of a circuit for an RC network that is calibrated depending on the ratio obtained using the actual value of an RC time constant of a reference network and a preset value.

Referring to FIG. 5, there illustrated is a circuit 70 having an RC network, functioning as a low-pass filter, with an adjustable RC time constant, and thus an adjustable frequency response. The RC network may comprise a resistor 72, and multiple circuit configurations, each with one of three switches 74–78 and a plurality of capacitors 80–92 connected in series with the respective switches 74–78. The capacitors 80–92 may be arranged such that the switch 74 switches a ($2^0$) capacitor 80, the switch 76 switches two ($2^1$) parallel-connected capacitors 82, 84 and the switch 78 switches four ($2^2$) parallel-connected capacitors 86–92. The circuit 70 may be expanded, with each additional switch serving to switch double the number of parallel-connected capacitors relative to the previous switch. By controlling the switches 74–78, a time constant τ can be set for the RC network, where the time constant may vary between τ=R·C and τ=7·R·C, and thus the multiple between 1 and 7 of a standardized time constant τ0=R·C. Given n switches, it is thus possible to set a time constant which can vary between τ0 and $(2^n-1)\cdot\tau 0$.

The circuit 70 may also include a control unit 94 for controlling the switches 74–78 and which sets the time constant of the low-pass filter. The control unit 94 supplies a digital data word according to which the switches 74–78 are turned on or off. The digital data word controlling the switches 74–78, and thus determining the time constant, may be generated depending on a user-defined signal E. Using this signal, the RC time constant can be set, and thus also the corner frequency of the low-pass filter, which frequency is proportional to the reciprocal of the RC time constant.

The control unit 94 may additionally be supplied with the ratio signal V=P/N to correct the signal E depending on this ratio signal to produce a desired time constant and thus a desired frequency response.

Although the present invention has been shown and described with respect to several preferred embodiments thereof, various changes, omissions and additions to the form and detail thereof, may be made therein, without departing from the spirit and scope of the invention.

The invention claimed is:

1. A method for determining a ratio of an actual value of an RC time constant of an RC network in an integrated circuit to a desired value of the RC time constant of the RC network, the method comprising the steps of:
    providing a first reference RC network with a first resistor and a first capacitor and a second RC network with a second resistor and a second capacitor, the first and second RC networks being oppositely connected in a circuit between first and second supply potentials, where time constants of the first and second RC networks are equal;
    defining a normalized RC time constant for the first and second reference RC networks;
    implementing successive charge and discharge cycles during a predetermined evaluation period, where the first and second capacitors are charged in a cycle during a charge time until a potential at a first node common to the first resistor and the first capacitor of the first reference RC network approximately corresponds to a potential at a second node common to the second resistor and the second capacitor of the second reference RC network, and where the first and second capacitors are subsequently discharged in a cycle for a discharge time;

matching the predetermined evaluation period to the normalized RC time constant such that where the RC time constant of the first and second reference RC networks corresponds to the normalized RC time constant then a predetermined number of charge and discharge cycles can be implemented during the predetermined evaluation period;

determining the number of charge and discharge cycles actually implemented during the predetermined evaluation period; and providing a value that corresponds to a quotient of the actual number of charge and discharge cycles and the predetermined number of charge and discharge cycles to provide a measure of the ratio of the normalized RC time constant to the RC time constant of the first and second reference RC networks.

2. The method of claim 1, where the discharge time comprises a predetermined period of time.

3. The method of claim 1, further comprising the steps of:
providing a clock signal with a period duration which corresponds to a quotient of the predetermined evaluation period and the predetermined number of charge and discharge cycles;
starting a counter that counts the clock signal in time with the beginning of the charge and discharge cycles; and
ending the charge and discharge cycles whenever the counter has changed its count by a value corresponding to the predetermined number of charge and discharge cycles.

4. The method of claim 1, further comprising the steps of providing a first switch connected in parallel to the first capacitor and a second switch connected in parallel to the second capacitor, and providing a comparator that compares the potentials at the first and second nodes, the first and second switches being discharged for a predetermined discharge time depending on a signal from an output of the comparator.

5. The method of claim 1, where the comparator controls a counter which is reset at the beginning of the charge and discharge cycles, and at the end of the charge and discharge cycles the counter provides a value corresponding to the number of charge and discharge cycles that have occurred.

6. A device for determining a ratio of an actual value of an RC time constant of an RC network in an integrated circuit to a desired value of the RC time constant of the RC network, comprising:
a first reference RC network having a first resistor and a first capacitor and a second reference RC network having a second resistor and a second capacitor, the first and second RC networks being oppositely connected between first and second supply potentials, a product of a resistance value of the first resistor and a capacitance value of the first capacitor being equal to a product of a resistance value of the second resistor and a capacitance value of the second capacitor;
a comparator having a first input connected to a first node common to the first resistor and the first capacitor and having a second input connected to a second node common to the second resistor and the second capacitor;
a counter having a count which is changed by an output signal from the comparator as clocked within an evaluation period;
first and second discharge circuits connected to the first and second capacitors respectively and which discharge the first and second capacitors respectively depending on the comparator output signal; and
means for the determining a quotient that represents a ratio between a normalized RC time constant of the first and second reference RC networks and an actual RC time constant of the first and second reference RC networks.

7. The device of claim 6, where the first and second discharge circuits each has a switch connected in parallel to the first and second capacitors, respectively.

8. A device for determining a ratio of an actual value of an RC time constant to a desired value of the RC time constant, the ratio being indicative of an amount by which the actual value of the RC time constant deviates from the desired value of the RC time constant, comprising:
a first reference RC network having a resistor and a capacitor and a second reference RC network having a resistor and a capacitor, the first and second reference RC networks having an RC time constant with a value that depends on values of the resistors and the capacitors of the first and second reference RC networks;
a comparator having a first input connected to a node of the first reference RC network and having a second input connected to a node of the second reference RC network, the comparator comparing the potentials at the nodes and providing an output signal indicative thereof;
a timing circuit that controls the charging and discharging of the capacitors of the first and second reference RC networks in response to the comparator output signal;
a counter having a count controlled by the comparator output signal, where the counter counts during a predetermined evaluation period of time;
a first charge and discharge circuit connected to the capacitor of the first reference RC network that charges and discharges the capacitor of the first reference RC network during the predetermined evaluation period of time;
a second charge and discharge circuit connected to the capacitor of the second reference RC network that charges and discharges the capacitor of the second reference RC network during the predetermined evaluation period of time;
where a predetermined number of the charges and discharges of the capacitors of the first and second reference RC networks depends on a length of the predetermined evaluation period of time; and
where the counter counts an actual number of the charges and discharges of the capacitors of the first and second reference RC networks that occur during the predetermined evaluation period of time, a quotient of the predetermined number of the charges and discharges and the actual number of the charges and discharges representing a ratio between the desired value and the actual value of the RC time constant of the first and second reference RC networks.

9. The device of claim 8, where the first and second RC networks are embodied in an integrated circuit.

10. The device of claim 8, where the first and second RC networks are oppositely connected between the first and second supply potentials.

11. The device of claim 8, where a product of a resistance value of the first resistor and a capacitance value of the first capacitor is equal to a product of a resistance value of the second resistor and a capacitance value of the second capacitor.

12. The device of claim 8 where the first charge and discharge circuit comprises a switch.

13. The device of claim 12, where the switch comprises a transistor.

14. The device of claim 8, where the second charge and discharge circuit comprises a switch.

15. The device of claim 14, where the switch comprises a transistor.

16. The device of claim 8, where the node of the first reference RC network is common to the resistor and the capacitor of the first reference RC network.

17. The device of claim 8, where the node of the second reference RC network is common to the resistor and the capacitor of the second reference RC network.

18. The device of claim 8, where the first charge and discharge circuit charges the capacitor of the first reference RC network during the predetermined evaluation period of time to a first predetermined potential, and where the first charge and discharge circuit discharges the capacitor of the first reference RC network during the predetermined evaluation period of time to a second predetermined potential.

19. The device of claim 8, where the second charge and discharge circuit charges the capacitor of the second reference RC network during the predetermined evaluation period of time to a first predetermined potential, and where the second charge and discharge circuit discharges the capacitor of the second reference RC network during the predetermined evaluation period of time to a second predetermined potential.

* * * * *

UNITED STATES PATENT AND TRADEMARK OFFICE
CERTIFICATE OF CORRECTION

| | | |
|---|---|---|
| PATENT NO. | : 7,071,711 B2 | Page 1 of 1 |
| APPLICATION NO. | : 10/884018 | |
| DATED | : July 4, 2006 | |
| INVENTOR(S) | : Bauer et al. | |

It is certified that error appears in the above-identified patent and that said Letters Patent is hereby corrected as shown below:

<u>Column 5</u>

Delete Equation 1 and insert --$(VDD-VSS) \cdot e^{-(tc-t0)/\tau} + VSS = (VDD-VSS) \cdot (1-e^{-(tc-t0)/\tau})$ --

Signed and Sealed this

Twenty-second Day of August, 2006

JON W. DUDAS
*Director of the United States Patent and Trademark Office*